United States Patent
Joo et al.

(10) Patent No.: US 10,910,593 B2
(45) Date of Patent: Feb. 2, 2021

(54) ORGANIC LIGHT EMITTING DISPLAY DEVICE

(71) Applicant: Samsung Display Co., Ltd., Yongin-si (KR)

(72) Inventors: Sun Kyu Joo, Suwon-si (KR); Byung Chul Kim, Suwon-si (KR); In Ok Kim, Osan-si (KR); Keun Chan Oh, Hwaseong-si (KR); Chang Soon Jang, Seoul (KR); In Seok Song, Pocheon-si (KR); Gak Seok Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/275,645

(22) Filed: Feb. 14, 2019

(65) Prior Publication Data
US 2019/0326545 A1 Oct. 24, 2019

(30) Foreign Application Priority Data

Apr. 20, 2018 (KR) ........................ 10-2018-0046229

(51) Int. Cl.
*H01L 51/52* (2006.01)
*H01L 27/32* (2006.01)
*G06F 3/041* (2006.01)

(52) U.S. Cl.
CPC ........... *H01L 51/525* (2013.01); *G06F 3/041* (2013.01); *H01L 27/322* (2013.01); *H01L 27/323* (2013.01); *H01L 51/5284* (2013.01)

(58) Field of Classification Search
CPC ... H01L 51/525; H01L 27/322; H01L 27/323; H01L 51/5284; H01L 51/5246; H01L 51/5256; G06F 3/041; G06F 3/044; G06F 3/0412; G06F 2203/04112
See application file for complete search history.

(56) References Cited

U.S. PATENT DOCUMENTS

| | | | |
|---|---|---|---|
| 2013/0026907 A1* | 1/2013 | Okumura | H01L 51/524 313/498 |
| 2014/0232971 A1* | 8/2014 | Kubota | G02F 1/1368 349/110 |
| 2015/0277017 A1* | 10/2015 | Aoyagi | H01L 51/5271 362/608 |
| 2016/0013254 A1* | 1/2016 | Ishii | H01L 51/525 257/88 |
| 2016/0334553 A1* | 11/2016 | Wu | G02F 1/1335 |
| 2017/0024075 A1* | 1/2017 | Chiang | G06F 3/0412 |
| 2017/0285459 A1 | 10/2017 | Seo et al. | |
| 2017/0293174 A1 | 10/2017 | Tai et al. | |
| 2018/0175115 A1* | 6/2018 | Choi | H01L 51/56 |

* cited by examiner

Primary Examiner — Bryan Earles
(74) Attorney, Agent, or Firm — Lewis Roca Rothgerber Christie LLP

(57) ABSTRACT

An organic light emitting display device includes: a first substrate; a plurality of pixels on the first substrate, each of the pixels including a corresponding portion of an organic light emitting layer on the first substrate; an encapsulation film on the organic light emitting layer; a protruding pattern layer on the encapsulation film and comprising a plurality of spacers at a boundary between adjacent ones of the pixels; an adhesive layer on the protruding pattern layer; and a second substrate on the adhesive layer.

20 Claims, 10 Drawing Sheets

ORGANIC LIGHT EMITTING DISPLAY DEVICE

CROSS-REFERENCE TO RELATED APPLICATION

This application claims priority to and the benefit of Korean Patent Application No. 10-2018-0046229, filed on Apr. 20, 2018 in the Korean Intellectual Property Office, the entire disclosure of which is incorporated herein by reference.

BACKGROUND

1. Field

Aspects of embodiments of the present invention relate to an organic light emitting display device.

2. Description of the Related Art

The importance of display devices has increased with the development of multimedia. Various types of display devices, such as liquid crystal displays (LCD) and organic light-emitting diode (OLED) displays, have recently been used.

From among the display devices, organic light emitting display devices display images by using organic light emitting elements that emit light by recombination of electrons and holes. The organic light emitting display device has a fast response speed, high luminance, and a wide viewing angle and is driven with low power consumption.

The organic light emitting display device may be applied to portable electronic appliances, such as smart phones. Recently, as slim portable electronic appliances have been developed, the organic light emitting display device is also becoming thinner. As the thickness of the organic light emitting display device decreases, the possibility of damage to elements therein due to an external force may increase.

SUMMARY

An embodiment of the present invention provides an organic light emitting display device having reduced possibility of damage to elements due to an external force.

According to an embodiment of the present invention, an organic light emitting display device includes: a first substrate; a plurality of pixels on the first substrate, each of the pixels including a corresponding portion of an organic light emitting layer on the first substrate; an encapsulation film on the organic light emitting layer; a protruding pattern layer on the encapsulation film and comprising a plurality of spacers at a boundary between adjacent ones of the pixels; an adhesive layer on the protruding pattern layer; and a second substrate on the adhesive layer.

According to another embodiment of the present invention, an organic light emitting display device includes: a first substrate; a plurality of pixels on the first substrate, each of the pixels including a corresponding portion of an organic light emitting layer on the first substrate; an encapsulation film on the organic light emitting layer; a black matrix on the encapsulation film along a boundary between adjacent ones of the pixels, the black matrix having openings exposing the pixels; a color filter in the openings in the black matrix and extending onto a surface of the black matrix to overlap the black matrix; an adhesive layer between the black matrix and the color filter, a lower surface of the adhesive layer contacting the black matrix and the color filter; and a second substrate on the adhesive layer.

However, aspects and features of the present invention are not restricted to those set forth above. The above and other aspects and features of the present invention will become more apparent to one of ordinary skill in the art to which the present invention pertains by referencing the detailed description below.

BRIEF DESCRIPTION OF THE DRAWINGS

The above and other aspects and features of the present invention will become more apparent by describing, in detail, exemplary embodiments thereof with reference to the attached drawings, in which.

DETAILED DESCRIPTION

Figure 1:
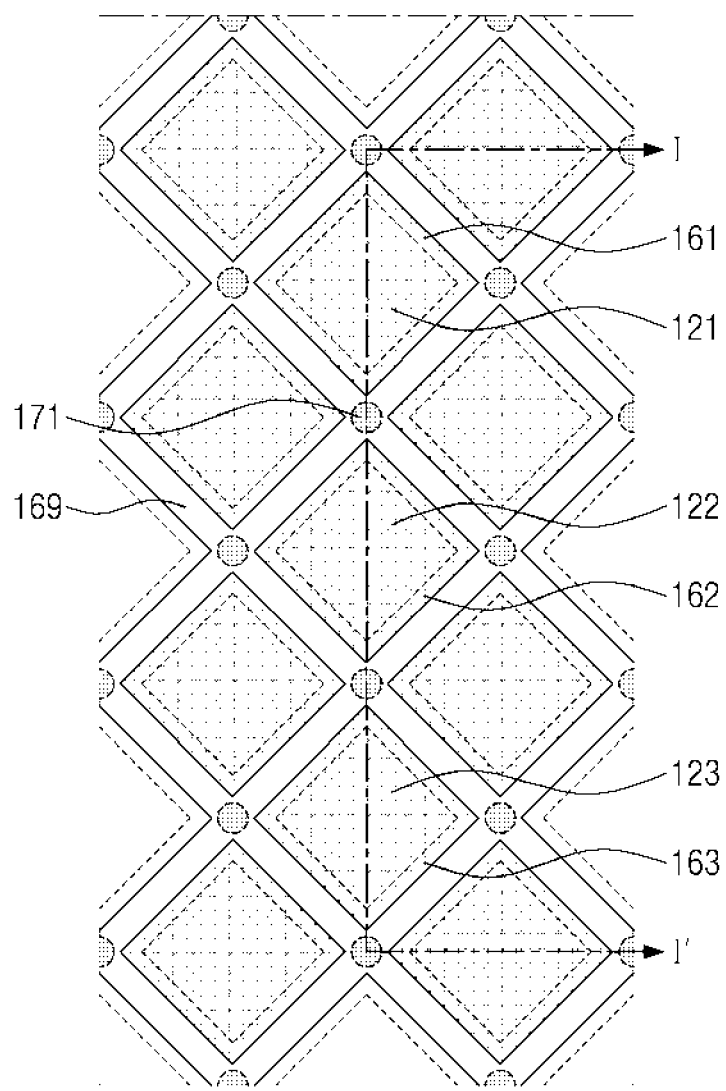
FIG. 1 is a schematic layout view of an organic light emitting display device according to an embodiment.

Aspects and features of the present invention and methods of accomplishing the same may be more readily understood by reference to the following detailed description of embodiments thereof and the accompanying drawings. The present invention may, however, be embodied in many different forms and should not be construed as being limited to the embodiments set forth herein. Rather, these embodiments are provided so that this disclosure will be thorough and complete and will fully convey the concept of the present invention to those skilled in the art. The present invention will be defined by the appended claims and their equivalents.

It will be understood that when an element or layer is referred to as being "on," "connected to," or "coupled to" another element or layer, it can be directly on, connected, or coupled to the other element or layer or intervening elements or layers may be present. When an element is referred to as being "directly on," "directly connected to," or "directly coupled to" another element or layer, no intervening elements or layers are present. As used herein, the term "and/or" includes any and all combinations of one or more of the associated listed items.

In the drawings, components may be exaggerated or reduced in size for convenience of explanation. The same reference numerals are used for the same or similar components throughout the specification. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively. As used herein, the term "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments. In the figures, dimensions of the various elements, layers, etc. may be exaggerated for clarity of illustration.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Hereinafter, embodiments of the present invention will be described with reference to the attached drawings.

FIG. 1 is a schematic layout view of an organic light emitting display device according to an embodiment.

Referring to FIG. 1, an organic light emitting display device 1 includes a plurality of pixels arranged in the form of a matrix. The plurality of pixels may be a plurality of color pixels. For example, the plurality of pixels may include red, green, and blue pixels (e.g., red, green, and blue sub-pixels). The plurality of pixels may further include white pixels (e.g., white sub-pixels). In other embodiments, cyan, magenta, and yellow pixels may be arranged instead of the red, green, and blue pixels. Hereinafter, an embodiment in which the organic light emitting display device 1 includes the red, green, and blue pixels will be described as an example.

The red, green, and blue pixels may be alternately arranged. Each pixel may have a rectangular shape. In some embodiments, each pixel may have a rhombic shape. However, the present invention is not limited thereto, and the respective pixels may have a rectangular or square shape.

Each pixel may include organic light emitting layers 121, 122, and 123 and first to third color filters 161, 162, and 163. In an embodiment, the first color filter 161 may be a red color filter, the second color filter 162 may be a green color filter, and the third color filter 163 may be a blue color filter. The red pixel (e.g., the red sub-pixel) may include a red organic light emitting layer 121 and the red first color filter 161, the green pixel (e.g., the green sub-pixel) may include a green organic light emitting layer 122 and the green second color filter 162, and the blue pixel (e.g., the blue sub-pixel) may include a blue organic light emitting layer 123 and the blue third color filter 163. In another embodiment, each of the pixels may also include a white organic light emitting layer and a color filter of the corresponding color. The white organic light emitting layer may be formed by laminating a plurality of organic light emitting layers.

In an embodiment, a black matrix 169 may be disposed at the boundary between the pixels (e.g., between the sub-pixels). The black matrix 169 may be formed in a lattice shape to divide the respective pixels.

A spacer 171 may be disposed at the boundary between the pixels. The spacer 171 improves the strength of the organic light emitting diode display 1. Details of the spacer 171 will be further described below.

Figure 2:
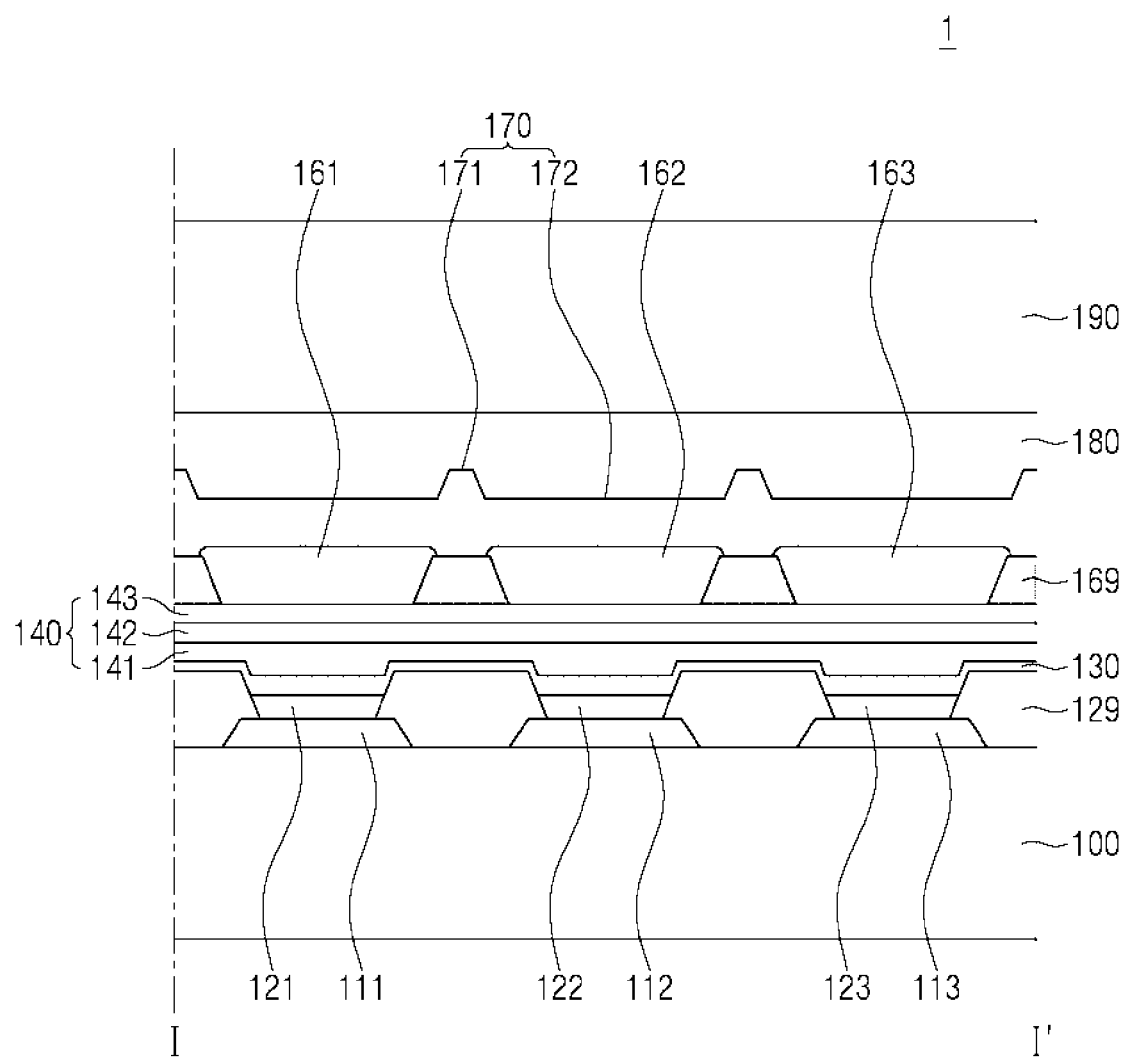
FIG. 2 is a cross-sectional view taken along the line I-I' of FIG. 1.

FIG. 2 is a cross-sectional view taken along the line I-I' of FIG. 1. The cross-sectional structure of the organic light emitting display device 1 will be described in detail with reference to FIG. 2.

The organic light emitting display device 1 includes a first substrate 100, the organic light emitting layers 121, 122, and 123 disposed on the first substrate 100, an encapsulation film 140 disposed on the organic light emitting layers 121, 122, and 123, the black matrix 169 and the color filters 161, 162, and 163 disposed on the encapsulation film 140, a protruding pattern layer 170 disposed on the black matrix 169 and the color filters 161, 162, and 163, an adhesive layer 180 disposed on the protruding pattern layer 170, and a second substrate 190 disposed on the adhesive layer 180. The organic light emitting display device 1 may be a front (or top) emission type display device in which light is emitted toward the second substrate 190 or a double side emission type display device.

The first substrate 100 includes an insulating substrate. The insulating substrate may be a rigid substrate or a flexible substrate. The insulating substrate may include (or may be made of) glass, quartz, a polymer resin, plastic, or the like. Examples of the polymer resin may include polyimide (PI), polyethersulfone (PES), polyacrylate (PA), polyarylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose triacetate (CAT), cellulose acetate propionate (CAP), and combinations thereof.

The first substrate 100 may further include other structures disposed on the insulating substrate. Examples of the other structures include wirings, electrodes, insulating films, and/or the like. In some embodiments, the first substrate 100 may include a plurality of thin film transistors arranged on the insulating substrate. At least some drain electrodes of the plurality of thin film transistors may be electrically connected to first electrodes 111, 112 and 113, to be further described below. The thin film transistors may include an active region including (or made of) amorphous silicon, polycrystalline silicon, monocrystalline silicon, or the like. In an embodiment, the thin film transistors may include an active region including (or made of) an oxide semiconductor.

A plurality of first electrodes 111, 112, and 113 are disposed on the first substrate 100. The first electrodes 111, 112, and 113 may be pixel electrodes, each being disposed for a corresponding pixel. Each of the first electrodes 111, 112, and 113 may be an anode electrode of a corresponding organic light emitting diode.

The first electrodes 111, 112, and 113 may include a material having a high work function. The first electrodes 111, 112 and 113 may include indium-tin-oxide (ITO), indium-zinc-oxide (IZO), zinc oxide (ZnO), indium oxide ($In_2O_3$), and/or the like. The above-exemplified conductive materials have a relatively high work function and transparent characteristics. When the organic light emitting display device 1 is a front emission type display device, the first electrodes 111, 112, and 113 may further include a reflective material, such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a mixture thereof, in addition to the above-described conductive material(s). The first electrodes 111, 112, and 113 may have a single-layer structure made of the above-described conductive material and the reflective material or may have a multi-layer structure in which the conductive material and the reflective material are laminated.

A pixel defining film 129 is disposed on the first electrodes 111, 112, and 113. The pixel defining layer 129 has openings exposing at least a portion of each of the first electrodes 111, 112, and 113. The pixel defining film 129 may include an organic material and/or an inorganic material. In some embodiments, the pixel defining film 129 may include a material, such as a photoresist, a polyimide resin, an acrylic resin, a silicon compound, or a polyacrylic resin.

The organic light emitting layers 121, 122, and 123 are disposed on (e.g., are respectively disposed on) the first electrodes 111, 112, and 113 exposed through the pixel defining film 129. The red organic light emitting layer 121 is disposed in a red pixel, the green organic light emitting layer 122 is disposed in a green pixel, and the blue organic light emitting layer 123 is disposed in a blue pixel.

A second electrode 130 is disposed on the organic light emitting layers 121, 122, and 123. The second electrode 130 may be a common electrode that is disposed over all of the pixels. The second electrode 130 may be a cathode electrode of the organic light emitting diode.

The second electrode 130 may include a material having a low work function. The second electrode 130 may include Li, Ca, lithium fluoride/calcium (LiF/Ca), lithium fluoride/aluminum (LiF/Al), Al, Mg, Ag, Pt, Pd, Ni, Au Nd, Ir, Cr, barium fluoride (BaF), barium (Ba), or a compound or mixture thereof (e.g., a mixture of Ag and Mg). The second electrode 130 may further include an auxiliary electrode. The auxiliary electrode includes a film formed by depositing the above-described material(s) and applying a transparent metal oxide, such as indium-tin-oxide (ITO), indium-zinc-oxide (IZO), zinc oxide (ZnO), or indium-tin-zinc-oxide (ITZO) on the film.

When the organic light emitting display device 1 is a front emission type display device, a conductive layer having a small work function may be formed into a thin film as the second electrode 130, and a transparent conductive film, such as an indium-tin-oxide (ITO) layer, an indium-zinc-oxide (IZO) layer, a zinc oxide (ZnO) layer, and an indium oxide ($In_2O_3$) layer, may be laminated on the thin film.

The above-described first electrodes 111, 112 and 113, organic light emitting layers 121, 122 and 123, and second electrode 130 may constitute organic light emitting diodes.

In some embodiments, a hole injection layer and/or a hole transporting layer may be disposed between the first electrodes 111, 112, and 113 and the organic light emitting layers 121, 122 and 123, and an electron transporting layer and/or an electron injection layer may be disposed between the organic light emitting layers 121, 122, and 123 and the second electrode 130.

The encapsulation film 140 is disposed on the second electrode 130. The encapsulation film 140 includes an inorganic film. The encapsulation film 140 may include a plurality of laminated films. The encapsulation film 140 is shown as a multi-layer film in FIG. 2, in which a first inorganic film 141, an organic film 142, and a second inorganic film 143 are sequentially laminated.

The first inorganic film 141 and the second inorganic film 143 may include at least one selected from the group consisting of silicon oxide ($SiO_x$), silicon nitride ($SiN_x$), and silicon oxynitride ($SiON_x$).

The organic film 142 may include any one selected from the group consisting of epoxy, acrylate, and urethane acrylate.

The black matrix 169 is disposed on the encapsulation film 140. The black matrix 169 is disposed along the boundary between the pixels and has openings exposing the pixels. The black matrix 169 may have a lattice shape extending along the boundaries between the pixels. The organic light emitting layers 121, 122, and 123 overlap (e.g., are aligned with) the openings in the black matrix 169.

The black matrix 169 may include a light-absorbing material or a light-reflecting material. For example, the black matrix 169 may include a black colored resin, a reflective metal, such as chromium (Cr), or the like.

A buffer layer or an organic layer may be formed between the black matrix 169 and the encapsulation film 140. The buffer layer and/or the organic layer may be formed as a single layer or a multilayered laminate.

The color filters 161, 162, and 163 may be disposed in the black matrix 169. The color filters 161, 162, and 163 are disposed in the openings in the black matrix 169 and may extend partially to the surface of (e.g., may extend above and/or onto the surface of) the black matrix 169.

The color filters 161, 162, and 163 may include a red first color filter 161, a green second color filter 162, and a blue third color filter 163. The red first color filter 161 selectively transmits red light. The wavelength of the red light may be in a range of about 620 nm to about 750 nm. The green first color filter 162 selectively transmits green light. The wavelength of the green light may be in a range of about 495 nm to about 570 nm. The blue first color filter 163 selectively transmits blue light. The wavelength of the blue light may be in a range of about 450 nm to about 495 nm.

The first color filter 161 is disposed in the red pixel, the second color filter 162 is disposed in the green pixel, and the third color filter 163 is disposed in the blue pixel. The color filters 161, 162, and 163 are respectively disposed on the organic light emitting layers 121, 122, and 123 having the same color, thereby preventing or reducing color mixing between the corresponding pixels and improving color reproducibility. In addition, the color filters 161, 162, and 163 absorb external light to a considerable extent to reduce the reflection of external light without additionally providing a polarizing plate or the like.

The shape of each of the first color filter 161, the second color filter 162, and the third color filter 163 may be substantially the same as the shape of the above-described pixels. For example, when the pixels have a rhombus shape, each color filter may also have a rhombus shape.

In other embodiments, adjacent color filters 161, 162, 163 may overlap each other, and further details of such an embodiment will be described below with reference to FIG. 7.

The protruding pattern layer 170 is disposed on the black matrix 169 and the color filters 161, 162, and 163. The protruding pattern layer 170 protects underlying elements from an external impact. The protruding pattern layer 170 may include a relaxation portion 172 and a spacer 171 physically connected to (e.g., integral with) the relaxation portion 172 and protruding upwardly from the relaxation portion 172. The protruding pattern layer 170 may have a surface step difference between the relaxation portion 172 and the spacer 171, which have different heights.

The relaxation portion 172 is disposed over the entire pixel region. The surface of the relaxation portion 172 may be substantially flat.

The spacer 171 is disposed on (e.g., extends from) the relaxation portion 172. The spacer 171 may be made of the same material as the relaxation portion 172. The spacer 171 may be integrally formed with the relaxation portion 172 without a physical boundary therebetween.

A thickness (e.g., a height) of the spacer 171 may be in a range of about 1 μm to about 3 μm, but the spacer 171 is not limited thereto. When the thickness of the spacer 171 is about 1 μm or greater, it may exhibit a desirable stress concentration effect further described below. When the thickness of the spacer 171 is about 3 μm or less, the spacer 171 may have sufficient strength and the shape of the spacer 171 may be stably maintained.

The plurality of spacers 171 may be provided. These spacers 171 may be connected to each other by the relaxation portion 172 (e.g., the relaxation portion 172 may extend between the spacers 171).

The spacers 171 may have a cylindrical shape, a polygonal column shape, a frustum shape, or the like, but the spacers 171 are not limited thereto.

The spacers 171 may be disposed at the boundaries between the pixels. Each of the spacers 171 may overlap the underlying black matrix 169. The spacers 171 may be disposed, for example, at each corner of each pixel when the pixels have the rectangular shape. However, the present invention is not limited thereto, and the spacers 171 may be disposed at some of the corners of each pixel at regular intervals and may also be disposed on the side of each pixel.

The protruding pattern layer 170 may be made of a transparent organic material. The protruding pattern layer 170 having the step difference may be formed by a single process by using a halftone mask or a slit mask, and further details thereof will be described below with reference to FIGS. 3 and 4.

Figure 3:
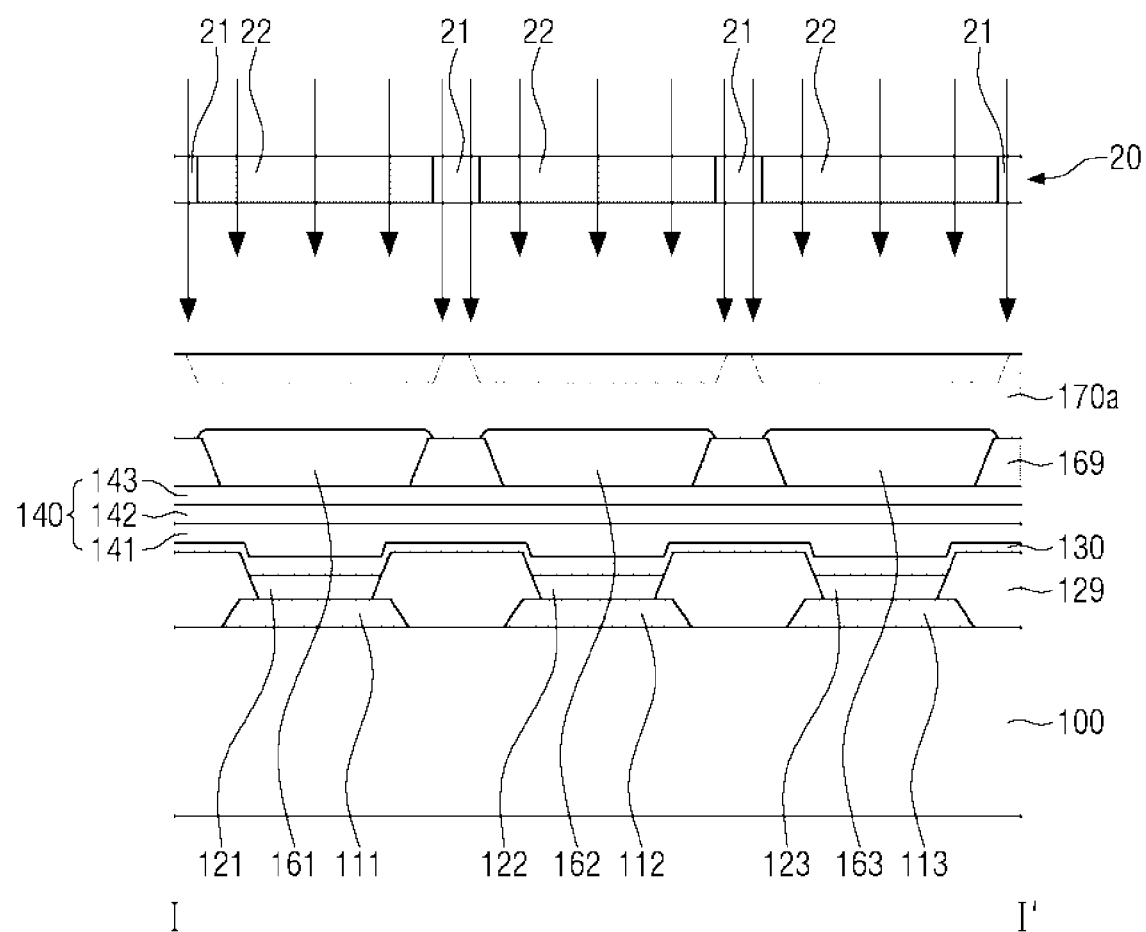
FIGS. 3 and 4 are cross-sectional views illustrating a process of forming a protruding pattern layer according to an embodiment.
Figure 4:
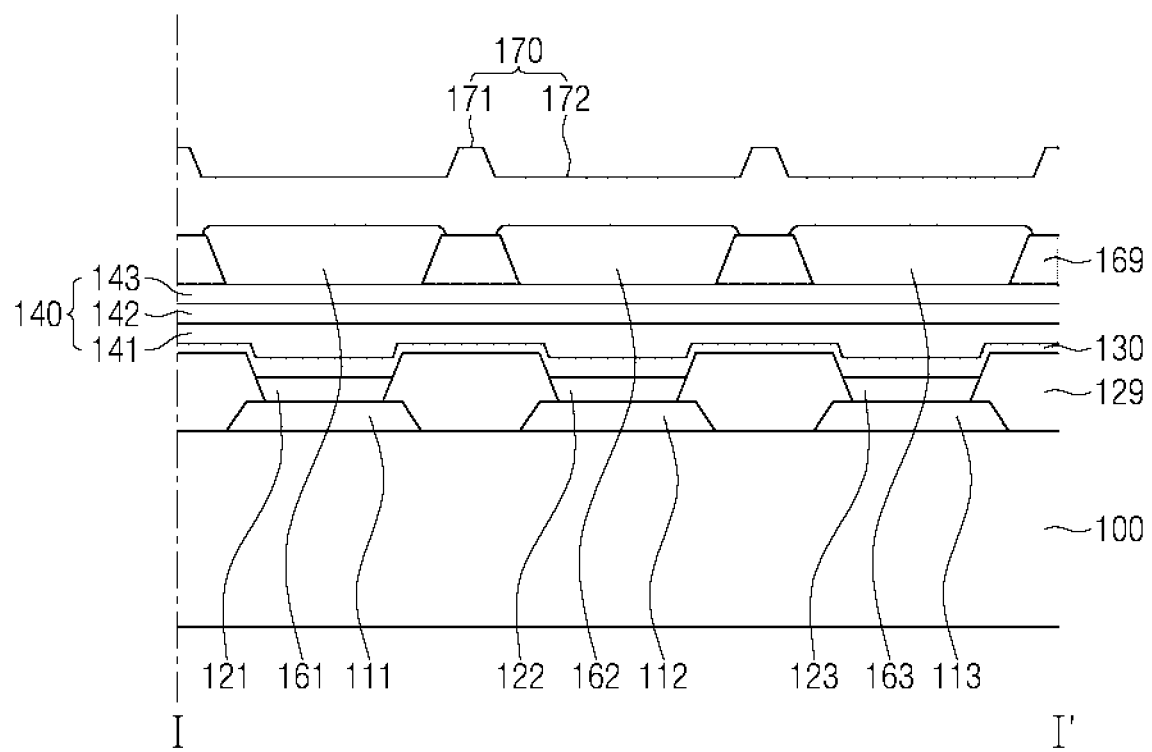

FIGS. 3 and 4 are cross-sectional views illustrating a process of forming the protruding pattern layer 170 according to an embodiment.

Referring to FIG. 3, an organic material layer 170a is formed on a substrate on which the black matrix 169 and the color filters 161, 162, and 163 are formed. The organic material layer 170a may be applied by slit coating, spin coating, gravure printing, or the like. The organic material layer 170a may include a photosensitive material. The photosensitive material may be a positive photosensitive material or a negative photosensitive material. An embodiment in which the organic material layer 170a includes a negative photosensitive material is exemplified below.

Next, a halftone mask 20 is disposed over the organic material layer 170a. The halftone mask 20 includes a light-transmitting portion 21 and a semi-light-transmitting portion 22. The light-transmitting portion 21 corresponds to a region where the spacer 171 is to be formed, and the semi-light-transmitting portion 22 corresponds to a region where the relaxation portion 172 is to be formed without the spacer 171. Next, through exposure and development processes, the protruding pattern layer 170 including the relaxation portion 172 and the spacer 171 may be completed as shown in FIG. 4.

Referring to FIG. 2, the adhesive layer 180 and the second substrate 190 are sequentially disposed on the protruding pattern layer 170. The second substrate 190 may be a transparent substrate including (or made of) glass, plastic, or the like. The second substrate 190 may be a window substrate, an encapsulation substrate, or a protective layer.

The adhesive layer 180 is interposed between the protruding pattern layer 170 and the second substrate 190 to couple the protruding pattern layer 170 with the second substrate 190. The adhesive layer 180 may include an adhesive, for example, an optically clear adhesive (OCA). As another example, the adhesive layer 180 may include an optically clear resin (OCR).

The upper surface of the relaxation portion 172 of the protruding pattern layer 170 contacts the lower surface of the adhesive layer 180. The thickness of the adhesive layer 180 may be in a range of about 100 μm to about 300 μm, for example, about 150 μm. Because the spacer 171 of the protruding pattern layer 170 penetrates into the adhesive layer 180, the adhesive layer 180 is slightly thinner in a region where the spacer 171 is disposed, but the thickness of the spacer 171 is only about 2% of the total thickness of the adhesive layer 180 so there may be almost no thickness variation of the adhesive layer 180 in these regions.

When the thickness of the spacer 171 is considerably greater than the thickness of the adhesive layer 180 (e.g., 50% or more) and the area where the spacer 171 of the protruding pattern layer 170 is disposed is substantially smaller than the area where the spacer 171 is not disposed (e.g., 10% or less), the average thickness of the adhesive layer 180 may be substantially constant. Therefore, even when the protruding pattern layer 170 includes the spacer 171, the reduction in the adhesion force can be reduced or minimized. Moreover, contact area between the adhesive layer 180 at the periphery of the spacer 171 slightly increases, which may contribute to an improvement in overall adhesion (or adhesion force).

Further, when the spacer 171 of the protruding pattern layer 170 penetrates into the adhesive layer 180, the protruding pattern layer 170 may not be lifted up from the adhesive layer 180 even by transverse external pressure.

Further, when pressure is applied in the thickness direction, stress is transferred to the protruding pattern layer 170 through the second substrate 190 and the adhesive layer 180. When the thickness of the adhesive layer 180 decreases according to the trend of organic light emitting display devices being thinner, more stress may be transferred to the lower portion of the adhesive layer 180. Because the stress is concentrated mainly on a protruding structure, the spacer 171 may be utilized as a main stress transfer passage when the spacer 171 having a protruding shape is provided at the lower portion of the adhesive layer 180.

The stress concentrated on the spacer 171 may be transferred to the underlying elements through the spacer 171. As described above, when the spacer 171 is disposed at the boundaries between the pixels, there is no organic light emitting diode structures, such as the organic light emitting layers 121, 122, and 123, immediately or directly below the spacer 171. Therefore, even if enough stress is transferred to the underlying encapsulation film 140 such that the encapsulation film 140 is damaged, the portion of the encapsulation film 140 subjected to this stress is relatively far away from the organic light emitting layers 121, 122 and 123 such that the possibility of damaging the organic light emitting layers 121, 122 and 123 due to the damage to the encapsulation film 140 is reduced.

Hereinafter, other embodiments will be described.

Figure 5:
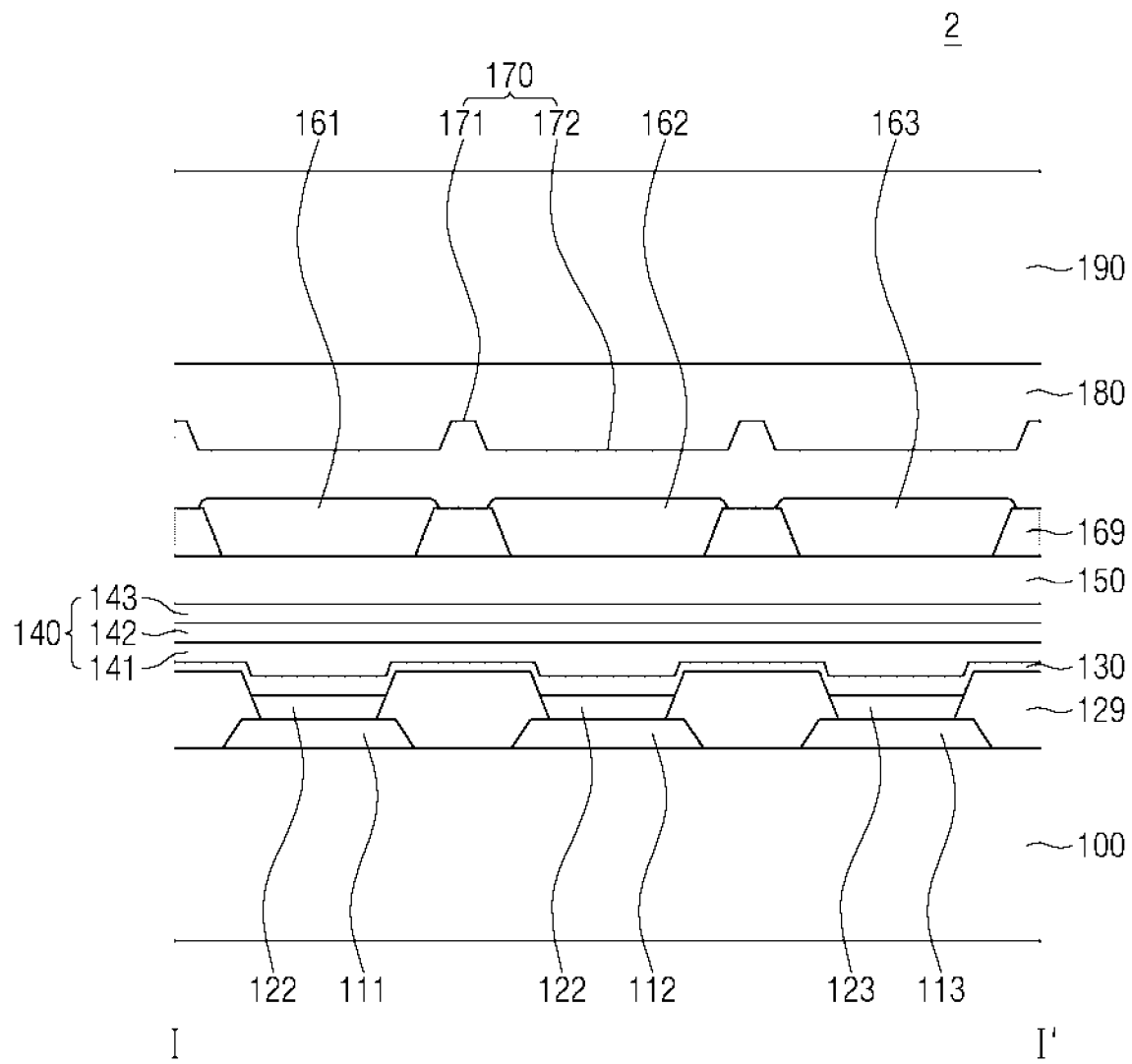
FIG. 5 is a schematic cross-sectional view of an organic light emitting display device according to another embodiment.
Figure 6:
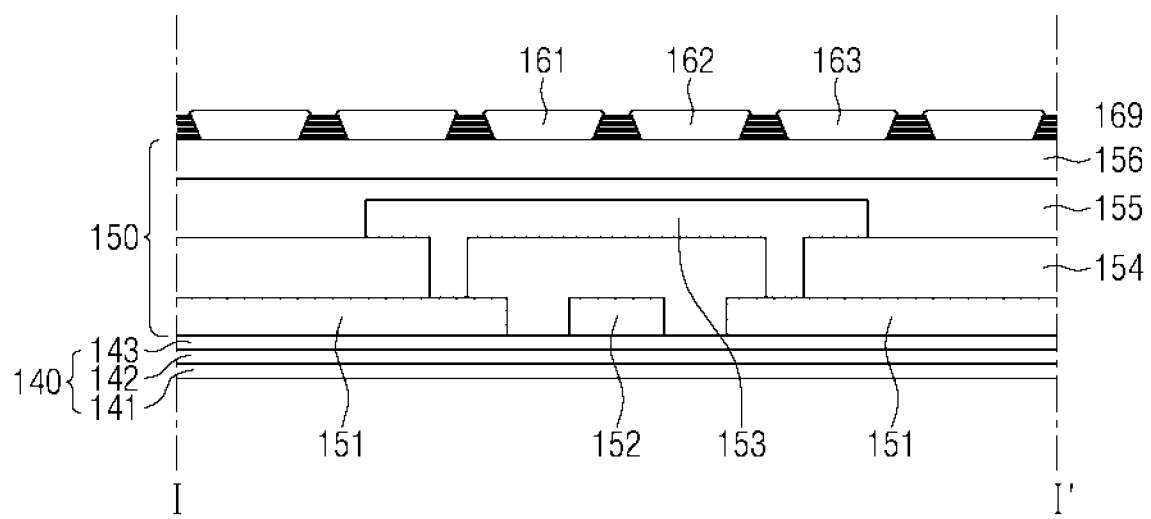
FIG. 6 is a cross-sectional view of a touch member shown in FIG. 5.

FIG. 5 is a schematic cross-sectional view of an organic light emitting display device according to an embodiment, and FIG. 6 is a cross-sectional view of a touch member shown in FIG. 5.

Referring to FIGS. 5 and 6, an organic light emitting display device 2 according to this embodiment is different from the organic light emitting display device 1 shown in FIG. 2 in that it includes a touch member 150 for recognizing a user's touch input. The touch member 150 may be arranged between the encapsulation film 140 and the black matrix 169 and between the encapsulation film 140 and the color filters 161, 162, and 163.

The touch member 150 includes a first touch electrode 151 and a second touch electrode 152. The first touch electrode 151 and the second touch electrode 152 are disposed on the encapsulation film 140. The first touch electrode 151 and the second touch electrode 152 may be disposed directly on the encapsulation film 140. The first touch electrode 151 and the second touch electrode 152 have a mesh shape in a plan view and may include a transparent metal, such as ITO or IZO, or a metal such as silver nanofiber, carbon nanofiber, or graphene.

A first insulating layer 154 covers the first touch electrode 151 and the second touch electrode 152 and is disposed on the first touch electrode 151 and the second touch electrode 152.

A connection wiring 153 is disposed on the first insulating layer 154. The connection wiring 153 electrically connects the adjacent first touch electrodes 151 through contact openings (e.g., contact holes) extending through the first insulating layer 154. The connection wiring 153 may include (or may be made of) a material having a lower resistance than the first touch electrode 151. The connection wiring 153 may include (or may be made of) an opaque material.

A second insulating layer 155 is disposed on the connection wiring 153 and the first insulating layer 154.

Each of the first insulating layer 154 and the second insulating layer 155 may include an inorganic material and/or an organic material. Examples of the inorganic material may include aluminum oxide, titanium oxide, silicon oxide silicon oxynitride, zirconium oxide, and hafnium oxide. Examples of the organic material may include an acrylic resin, a methacrylic resin, polyisoprene, a vinyl resin, an epoxy resin, a urethane resin, a cellulose resin, a siloxane resin, a polyimide resin, a polyamide resin, and a perylene resin.

An overcoat layer 156 is disposed on the second insulating layer 155. The overcoat layer 156 may be an insulating film. The overcoat layer 156 may be a planarization film for alleviating a step difference of an underlying structure and may include (or may be made of) an organic material, such as polyimide, a benzocyclobutene-based resin, or acrylate.

The black matrix 169 and the color filters 161, 162, and 163 are disposed on the overcoat layer 156. The black matrix 169 and the color filters 161, 162, and 163 may contact the surface of the overcoat layer 156.

Although, in the illustrated embodiment, the first touch electrode 151 and the second touch electrode 152 are disposed on the same layer, the present invention is not limited thereto. In other embodiments, the first touch electrode 151 and the second touch electrode 152 may be disposed in different layers with an insulating film interposed therebetween. Further, although the overcoat layer 156 is disposed between the second insulating layer 155 and the black matrix 169 and between the second insulating layer 155 and the color filters 161, 162, and 163 in the illustrated embodiment, the overcoat layer 156 may be omitted in some embodiments. In an embodiment in which the overcoat layer 156 is omitted, the black matrix 169 and the color filters 161, 162, and 163 may be disposed directly on the second insulating layer 155.

In the following embodiments, organic light emitting display devices including the above-described touch member 150 are illustrated as examples, but in each of the embodiments, the touch member 150 may be omitted.

Figure 7:
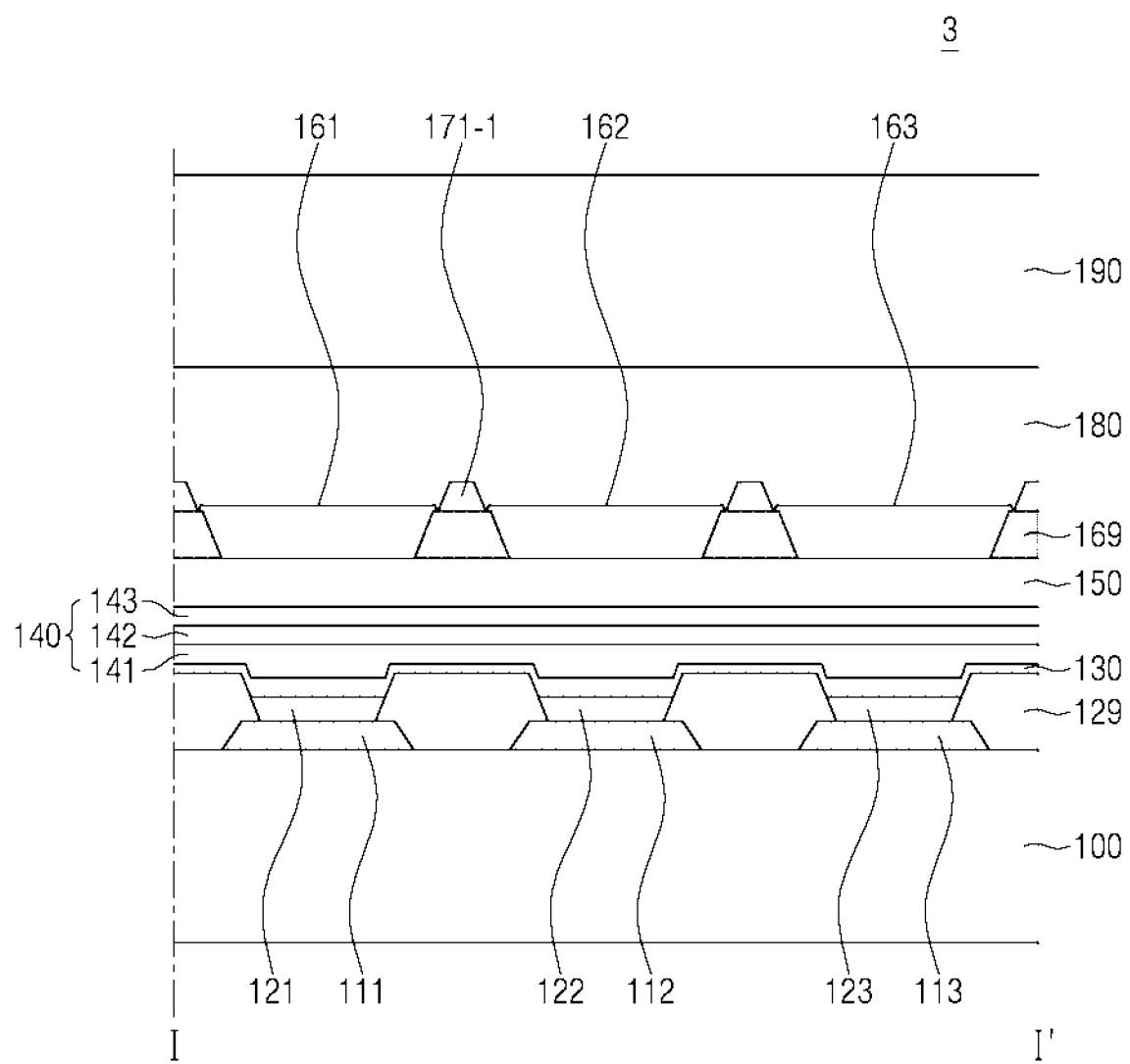
FIG. 7 is a schematic cross-sectional view of an organic light emitting display device according to an embodiment.

FIG. 7 is a schematic cross-sectional view of an organic light emitting display device according an embodiment.

An organic light emitting display device 3 shown in FIG. 7 is different from the organic light emitting display device 2 shown in FIG. 5 in that the protruding pattern layer 170 includes a plurality of spacers 171-1 separated from (e.g., spaced from) each other without the relaxation portion 172.

For example, the black matrix 169 having openings for exposing the pixels is disposed on the touch member 150. The color filters 161, 162, and 163 may be disposed in the openings in the black matrix 169 and may extend to the surface of the black matrix 169.

The spacers 171-1 are disposed on the black matrix 169. The spacers 171-1 are disposed such that the height of the upper end of the spacers 171-1 is above the upper end (e.g., upper surface) of each of the color filters 161, 162 and 163.

Each of the spacers 171-1 may overlap the black matrix 169 and may be disposed at the boundaries between the pixels. The spacers 171-1 are separated from (e.g., spaced from) each other and are arranged independently because the relaxation portion 172 is omitted.

The adhesive layer 180 and the second substrate 190 are sequentially disposed on the black matrix 169, the spacers 171-1, and the color filters 161, 162, and 163. The lower surface of the adhesive layer 180 may be in contact with the spacers 171-1, the color filters 161, 162, and 163, and the black matrix 169. Other elements, arrangements, and configurations are substantially the same as those of the embodiment shown in FIG. 5.

In this embodiment, because a protruding pattern is formed by the spacers 171-1 under the adhesive layer 180, stress is concentrated on the spacer 171-1 so that underlying elements are protected from an external impact as described with reference to the embodiment shown in FIG. 5.

Although the black matrix 169 and the spacers 171-1 are illustrated as being different elements in this embodiment, the present invention is not limited thereto. The black matrix 169 and the spacers 171-1 may be integrally formed as a black column matrix (BCS) structure.

Figure 8:
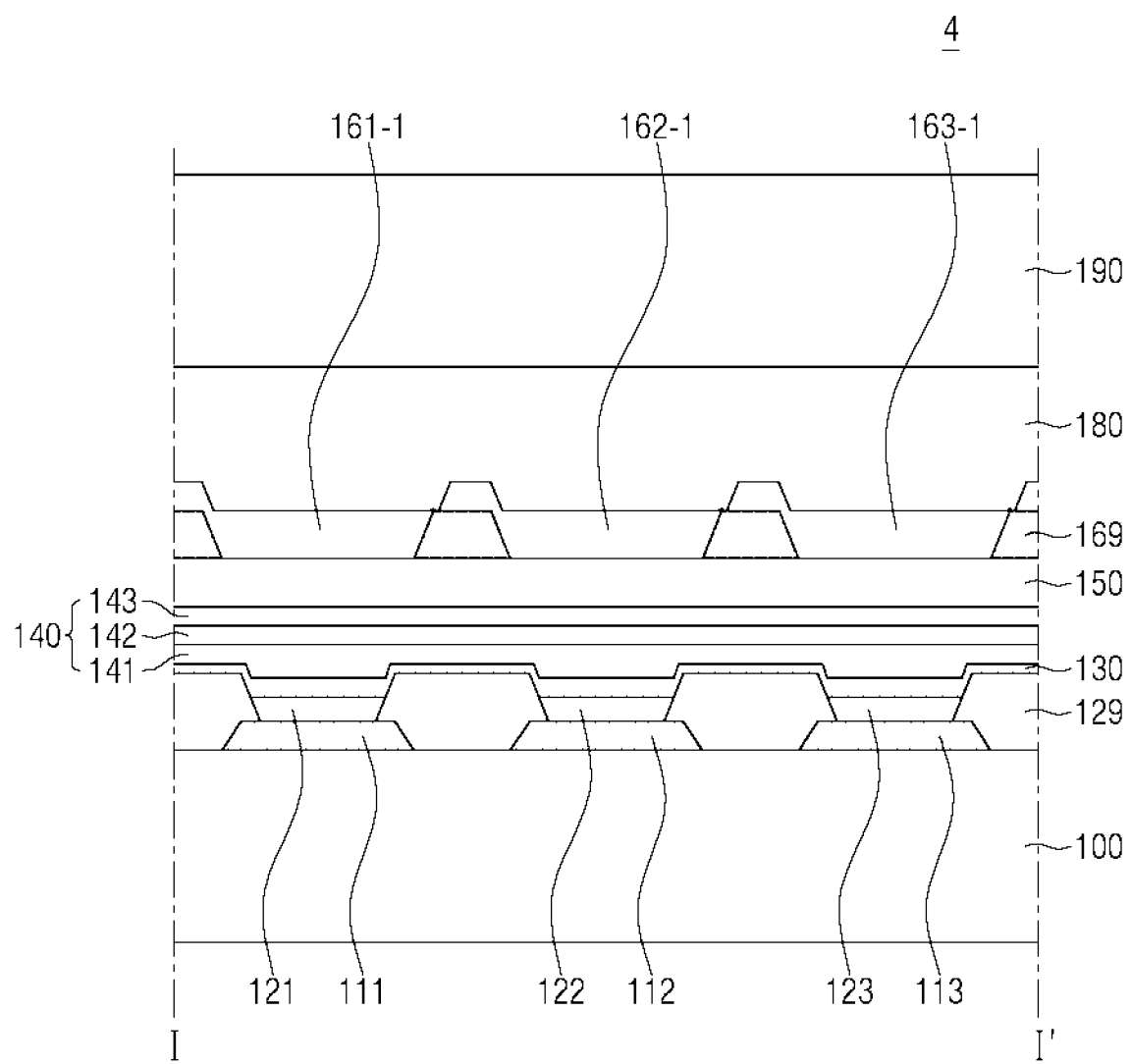
FIG. 8 is a schematic cross-sectional view of an organic light emitting display device according to an embodiment.

FIG. 8 is a schematic cross-sectional view of an organic light emitting display device according to an embodiment.

An organic light emitting display device 4 shown in FIG. 8 is different from the organic light emitting display device 2 shown in FIG. 5 in that color filters 161-1, 162-1, and 163-1 are disposed up to the upper surface of the black matrix 169, have a thickness (e.g., a predetermined thickness), and overlap the black matrix 169 to form a protruding pattern.

The color filters 161-1, 162-1, and 163-1 are disposed in the openings in the black matrix 169, extend to the surface of the black matrix 169 (e.g., extend over the surface of the black matrix 169), have a thickness, and overlap the black matrix 169. The portions of the color filters 161-1, 162-1, and 163-1 that overlap the black matrix 169 protrude upwardly from the portions of the color filters 161-1, 162-1, and 163-1 overlapping the pixels. The protruding height in the overlapping region, in other words, the protruding height of the color filters 161-1, 162-2, and 163-1 overlapping the black matrix 169, from the surface (e.g., the upper surface) of the color filters 161-1, 162-2, and 163-1 disposed in the openings in the black matrix 169 may be in a range of about 1 µm to about 3 µm, which is equal or substantially similar to the height of the spacer 171 shown in FIG. 5.

The lower surface of the adhesive layer 180 may contact the black matrix 169 and the color filters 161-1, 162-1, and 163-1.

In this embodiment, because the protruding pattern is formed by the laminate structure of the black matrix 169 and the color filters 161-1, 162-1, and 163-1, and because the separate spacers 171 are omitted, it is possible to reduce the possibility of damage to the underlying organic light emitting layers 121, 122, and 123 due to external stress by a relatively simple structure and/or process.

Figure 9:
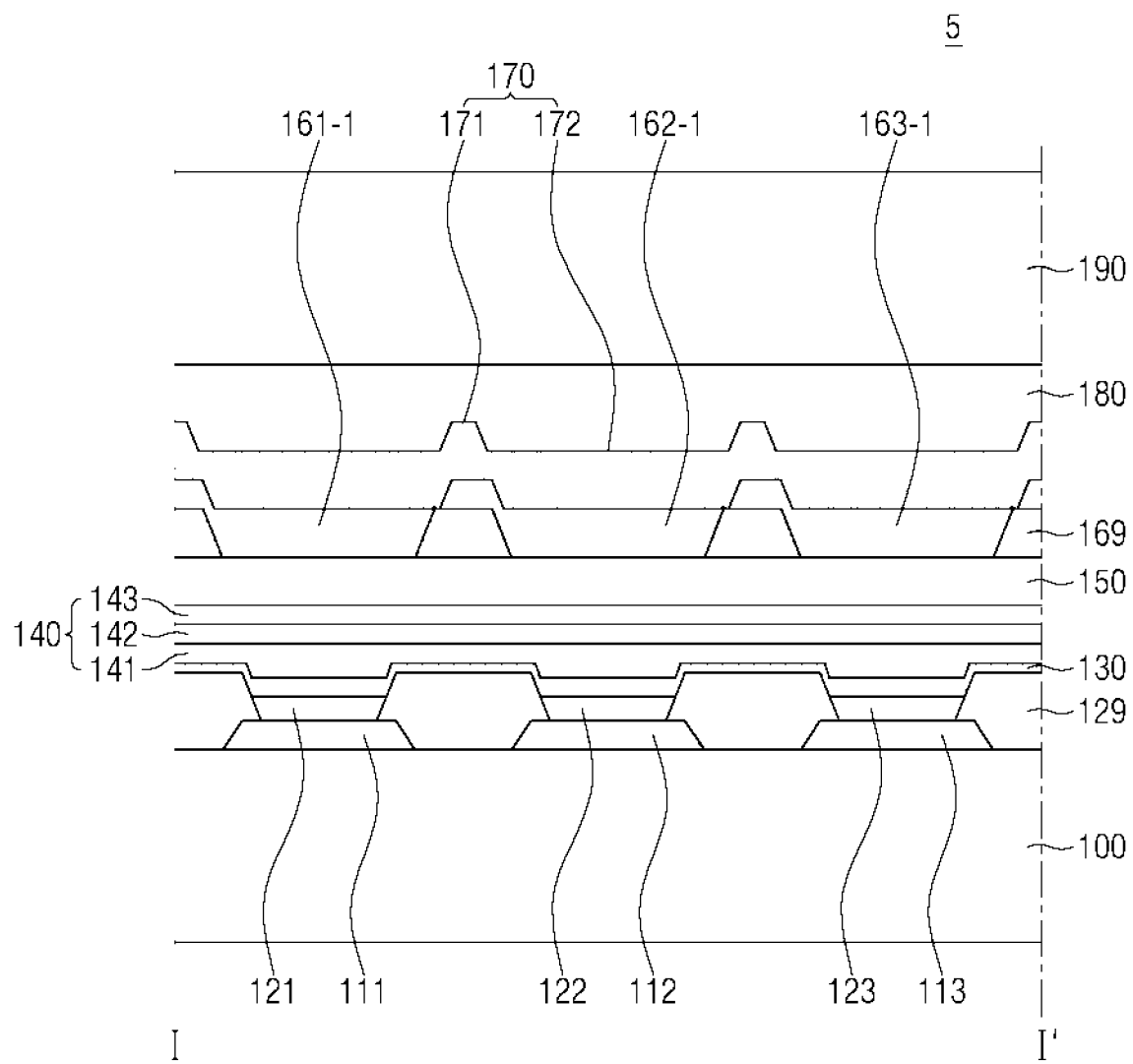
FIG. 9 is a schematic cross-sectional view of an organic light emitting display device according to an embodiment.

FIG. 9 is a schematic cross-sectional view of an organic light emitting display device according to an embodiment.

An organic light emitting display device 5 shown in FIG. 9 is the same as the organic light emitting display device 4 shown in FIG. 8 in that the color filters 161-1, 162-1, and 163-1 are disposed up to the upper surface of the black matrix 169, have a thickness (e.g., a predetermined thickness), and overlap the black matrix 169 but is different from the organic light emitting display device 4 shown in FIG. 8 in that a separate protruding pattern layer 170 is further disposed on the color filters 161-1, 162-1, and 163-1 and the black matrix 169.

The protruding pattern layer 170 of this embodiment includes a spacer 171 and a relaxation portion 172, similar to the protruding pattern layer 170 having been described with reference to FIG. 5. The spacer 171 of the protruding pattern layer 170 may overlap a region where the underlying color filters 161-1, 162-1, and 163-1 and the black matrix 169 are laminated. Accordingly, the spacer 171 may have a sufficient height.

In this embodiment, the spacer 171 overlapping the laminated pattern of the color filters 161-1, 162-1, and 163-1 and the black matrix 169 may transfer external stress downwardly. The transferred stress may primarily damage the underlying laminated pattern of the color filters 161-1, 162-1, and 163-1 and the black matrix 169, thereby partially consuming (or absorbing) the stress. Therefore, it is possible to more effectively protect the elements under the spacer 171 from external stress.

Figure 10:
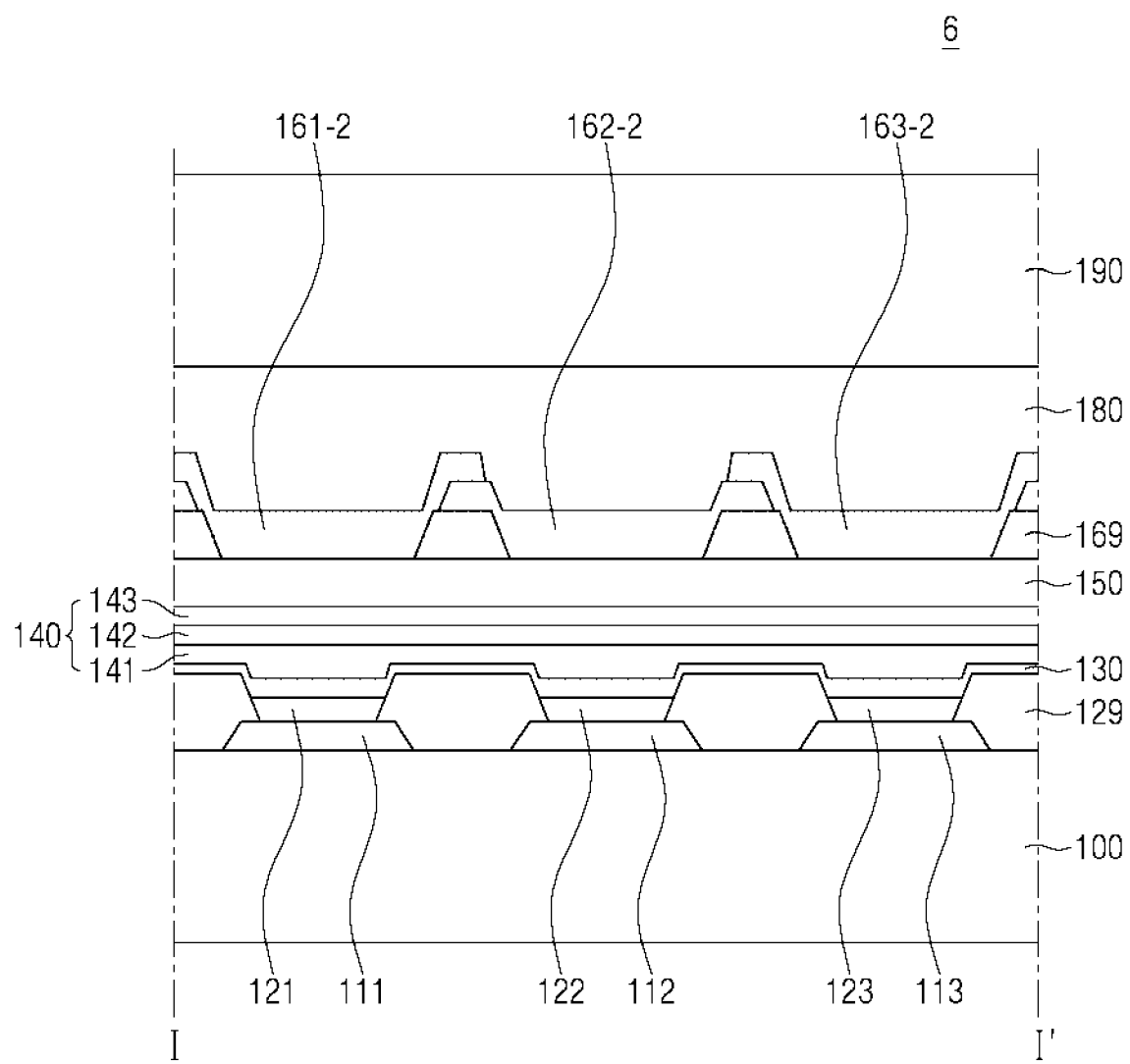
FIG. 10 is a schematic cross-sectional view of an organic light emitting display device according to an embodiment.

FIG. 10 is a schematic cross-sectional view of an organic light emitting display device according to an embodiment.

An organic light emitting display device 6 shown in FIG. 6 is different from the organic light emitting display device 4 shown in FIG. 8 in that adjacent ones of a plurality of color filters 161-2, 162-2, and 163-2 on the black matrix 169 overlap and are laminated on each other.

The black matrix 169 has openings for exposing pixels and is disposed on a touch member 150. The first color filter 162-2 is disposed in the opening in the black matrix exposing the first pixel, extends to the surface of the black matrix 169, has a thickness (e.g., a predetermined thickness), and overlaps the black matrix 169. The second color filter 161-2 is disposed in the opening in the black matrix exposing the second pixel adjacent to the first pixel, extends to the surface of the black matrix 169 and to the upper surface of the first color filter 162-2 on the surface of the black matrix 169 to have a thickness, and overlaps the black matrix 169 and the first color filter 162-2.

The overlapped and laminated structure of the black matrix 169, the first color filter 162-2, and the second color filter 161-2 may protrude upwardly from the color filters 161-2, 162-2, and 163-2 of the pixel. The protruding height of the overlapping region may be in a range of about 1 µm to about 3 µm, which is equal or substantially similar to the height of the spacers 171 shown in FIG. 5. The protruding pattern in the overlapping region may perform substantially the same function as the spacers 171 described with reference to FIG. 5.

The lower surface of the adhesive layer 180 may contact the black matrix 169 and the color filters 161-2, 162-2, and 163-2.

In this embodiment, because a protruding pattern having a sufficient thickness is formed by the laminated structure of the black matrix 169 and the plurality of color filters 161-2, 162-2, and 163-2, and because the separate spacers 171 are omitted, the possibility of damage to the underlying organic light emitting layers 121, 122, and 123 due to stress may be reduced.

As described above, according to embodiments of the present invention, a protruding pattern is formed on a color filter and an adhesive layer is disposed thereon such that an external impact may not be immediately (or directly) transmitted to the organic light emitting layer by the protruding pattern, thereby reducing the possibility of damage to elements while also reducing the reflectance of external light.

The aspects and features of the present invention are not limited by the foregoing, and other various aspects and features are considered and anticipated herein.

Although exemplary or example embodiments of the present invention have been disclosed herein for illustrative purposes, those skilled in the art will appreciate that various modifications, additions, and substitutions are possible without departing from the scope and spirit of the present invention as disclosed in the accompanying claims and their equivalents.

What is claimed is:

1. An organic light emitting display device comprising:
a first substrate;
a plurality of pixels on the first substrate, each of the pixels comprising a corresponding portion of an organic light emitting layer on the first substrate;
a color filter on the pixels;
an encapsulation film on the organic light emitting layer;
a protruding pattern layer on the encapsulation film and comprising a plurality of spacers between adjacent ones of the pixels and protruding away from the pixels in a direction normal to the first substrate;
an adhesive layer on the protruding pattern layer; and
a second substrate on the adhesive layer,
wherein the protruding pattern layer is between the adhesive layer and the encapsulation film, and wherein the color filter is between the protruding pattern layer and the pixels.

2. The organic light emitting display device of claim 1, wherein the protruding pattern layer comprises a relaxation portion under the spacers, and
wherein the spacers are physically connected to each other through the relaxation portion.

3. The organic light emitting display device of claim 2, wherein the relaxation portion covers the pixels, and
wherein the protruding pattern layer comprises a transparent material.

4. The organic light emitting display device of claim 3, further comprising:
a black matrix on the encapsulation film along a boundary between the adjacent ones of the pixels, the black matrix having openings exposing the pixels,
wherein the color filter is in the openings in the black matrix.

5. The organic light emitting display device of claim 4, wherein the protruding pattern layer is on the black matrix and the color filter.

6. The organic light emitting display device of claim 5, wherein a lower surface of the adhesive layer contacts the relaxation portion and the spacers of the protruding pattern layer.

7. The organic light emitting display device of claim 2, wherein the spacers have a thickness in a range of 1 μm to 3 μm.

8. The organic light emitting display device of claim 1, wherein the adhesive layer comprises an optical clear adhesive or an optical clear resin, and
wherein the spacers penetrate into the adhesive layer.

9. The organic light emitting display device of claim 1, wherein adjacent ones of the spacers are spaced from each other.

10. The organic light emitting display device of claim 9, further comprising:
a black matrix on the encapsulation film along a boundary between the adjacent ones of the pixels,
wherein the spacers are on the black matrix.

11. The organic light emitting display device of claim 10, wherein a lower surface of the adhesive layer contacts the spacers and the black matrix.

12. The organic light emitting display device of claim 1, wherein the pixels have a rectangular shape, and
wherein each of the spacers is at a corner of one of the pixels.

13. The organic light emitting display device of claim 1, further comprising a touch member between the encapsulation film and the protruding pattern layer.

14. The organic light emitting display device of claim 13, wherein the touch member comprises a sensing electrode directly on the encapsulation film.

15. The organic light emitting display device of claim 14, further comprising:
a black matrix on the touch member along a boundary between the adjacent ones of the pixels, the black matrix having openings exposing the pixels,
wherein the color filter is in the openings.

16. The organic light emitting display device of claim 15, wherein the touch member comprises an insulating film covering the sensing electrode, and
wherein the black matrix and the color filter contact the insulating film.

17. The organic light emitting display device of claim 1, further comprising:
a first electrode between the first substrate and the organic light emitting layer; and
a second electrode between the organic light emitting layer and the encapsulation film.

18. An organic light emitting display device comprising:
a first substrate;
a plurality of pixels on the first substrate, each of the pixels comprising a corresponding portion of an organic light emitting layer on the first substrate;
an encapsulation film on the organic light emitting layer;
a black matrix on the encapsulation film along a boundary between adjacent ones of the pixels, the black matrix having openings exposing the pixels;
a color filter in the openings in the black matrix and extending onto a surface of the black matrix facing away from the plurality of pixels to overlap the black matrix;
an adhesive layer on the black matrix and the color filter, a lower surface of the adhesive layer contacting the black matrix and the color filter; and
a second substrate on the adhesive layer,
wherein the black matrix and the color filter are between the adhesive layer and the encapsulation film, and
wherein a portion of the color filter extending onto the surface of the black matrix protrudes above a surface of a portion of the color filter in the openings in a direction normal to the first substrate.

19. The organic light emitting display device of claim 18, wherein a protruding height of the portion of the color filter extending onto the surface of the black matrix is in a range of 1 μm to 3 μm.

20. The organic light emitting display device of claim 18, further comprising:
a touch member on the encapsulation film, the touch member comprising a sensing electrode directly on the encapsulation film and an insulating film covering the sensing electrode,
wherein the black matrix and the color filter contact the insulating film.

* * * * *